(12) United States Patent
De Caria (10) Patent No.: US 10,678,136 B2
(45) Date of Patent: Jun. 9, 2020

(54) FEEDING ASSEMBLY FOR LOADING A FLEXOGRAPHIC PLATE IN A TREATMENT STATION

(71) Applicant: Sasu Vianord Engineering, Carros (FR)

(72) Inventor: Riccardo De Caria, Basiglio (IT)

(73) Assignee: Sasu Vianord Engineering, Carros (FR)

( * ) Notice: Subject to any disclaimer, the term of this patent is extended or adjusted under 35 U.S.C. 154(b) by 38 days.

(21) Appl. No.: 15/975,513

(22) Filed: May 9, 2018

(65) Prior Publication Data
US 2018/0329303 A1 Nov. 15, 2018

(51) Int. Cl.
| | | |
|---|---|---|
| *B41F 27/12* | (2006.01) | |
| *B41F 27/14* | (2006.01) | |
| *G03F 7/00* | (2006.01) | |
| *G03F 7/30* | (2006.01) | |
| *G03F 7/20* | (2006.01) | |

(52) U.S. Cl.
CPC ............ *G03F 7/3057* (2013.01); *B41F 27/14* (2013.01); *G03F 7/2004* (2013.01); *G03F 7/2032* (2013.01); *G03F 7/3064* (2013.01)

(58) Field of Classification Search
CPC ........ G03F 7/20; G03F 7/2004; G03F 7/2032; G03F 7/30; G03F 7/3057; G03F 7/3064; B41F 27/12; B41F 27/1206; B41F 27/14

USPC .......................................................... 101/477
See application file for complete search history.

(56) References Cited

U.S. PATENT DOCUMENTS

| | | | | |
|---|---|---|---|---|
| 5,552,262 | A * | 9/1996 | Konermann | B41M 1/04 134/15 |
| 5,684,571 | A | 11/1997 | Powers et al. | |
| 2009/0013888 | A1 | 1/2009 | Danon | |
| 2018/0217502 | A1* | 8/2018 | Dietz | G03F 7/202 |

FOREIGN PATENT DOCUMENTS

| | | |
|---|---|---|
| CA | 2958912 | 3/2016 |
| DE | 4231103 | 3/1994 |
| EP | 2839345 | 2/2015 |
| EP | 3121653 | 1/2017 |
| WO | WO2016030450 | 3/2016 |

\* cited by examiner

*Primary Examiner* — Leslie J Evanisko
(74) *Attorney, Agent, or Firm* — Stetina Brunda Garred and Brucker (57) ABSTRACT

The present invention relates to a feeding assembly (1) for automatically loading a flexographic plate (5) in a treatment station (7). The assembly according to the invention comprises a punching unit of said plate (5), handling means (5) for moving the flexographic plate from a loading surface to said punching unit and from said punching unit to a housing site in which a pin bar (14) which can be connected to said plate (5) is arranged. According to the invention, the handling means are configured to connect the plate (5) to said bar automatically and to move the bar, at the end of such a connection, to a predetermined position in which it can be coupled to a treatment system (77) of said treatment station.

10 Claims, 10 Drawing Sheets

FEEDING ASSEMBLY FOR LOADING A FLEXOGRAPHIC PLATE IN A TREATMENT STATION

FIELD OF THE INVENTION

The present invention relates to the field of manufacturing digital printing plates for flexography. In particular, the present invention relates to a feeding assembly for automatically inserting a flexographic plate inside a treatment station which may be, for example, a washing station or an exposure station. The invention also relates to a system comprising at least one treatment station and at least one feeding assembly according to the present invention.

BACKGROUND ART

Flexography is a direct rotary printing method which employs plates in relief made of photo-polymeric materials. The plates are flexible and soft, hence the name flexography. Such plates are inked and the print is obtained by means of direct deposition of the ink on the medium to be printed by virtue of a slight pressure exerted by a printing cylinder on which the plates are positioned.

Flexography is a high-speed printing process, capable of printing on many types of absorbing and non-absorbing materials. Some typical applications of flexographic printing are the production of paper and plastic bags, milk cartons, disposable cups and the like, but by virtue of the progress in printing quality, flexography is today also used for printing newspapers, for example, as well as packets and labels and for printing on plastic, films and acetate sheets, packing paper and on many other materials used for product packaging.

"Digital flexography" is a particular type of flexographic printing in which digital plates are used. In such plates, the photo-polymer is originally covered by a surface layer of material which prevents photo-exposure, such as for example a carbon or graphite layer. Such a layer of material is etched so as to create the negative image of the print subject. Such a step of etching is usually performed by means of a digital laser, controlled by a computer (hence the acronym CTP "Computer To Plate" used to indicate this step of the pre-printing process in the sector). The plate is then photo-exposed and the material not exposed to light is eliminated by washing with solvent or other liquid and then dried in an oven.

Systems which allow the production of digital plates according to the principle described above are known. These systems provide the use of various treatment stations, among which a photo-exposure station and a washing station, in which the material not exposed to light is eliminated from the plate after photo-exposure. Normally, these systems also comprise an oven, operatively downstream of the washing station, to dry the plate. Downstream of the oven, an exposure station may be further provided in which the plates are exposed to UV-A, to allow the polymerization of the parts of the polymer, generally at minimum size details of the image to be printed, which were not removed by the brushes while washing, and/or are exposed to UV-C, to eliminate the "stickiness" of the polymer.

On more recent versions, digital plate treatment systems extend substantially "in line". Patent application EP 2839345 by the Applicant, for example, describes a system comprising a washing station in line with an exposure station and moving means which allow a continuous movement of the plate between the two treatment stations. Patent application WO 2016/030450 describes an in-line system conceptually similar to the one described in EP 2839345, in which a drying station of the flexographic plates is provided downstream of the washing station. Such a system comprises automatic moving means which pick the plates let out from the washing station and store them in specific drying boxes.

On some systems, the photo-exposure of the plate is performed in an autonomous treatment station, i.e. separated from the rest of the system comprising the washing station and the drying station. In this regard, patent application EP 3121653 describes an autonomous station for the photo-exposure of digital plates. In this case, at the end of the photo-exposure, the digital plate is picked and loaded into the washing station of the system. The latter may or may not be in line with the drying station.

On in-line systems, the plates are typically advanced through the treatment stations by using a pin bar to which the plate is coupled. Specifically, such a bar comprises a row of pins configured to be inserted into corresponding holes defined near a front edge of the plate, where the word "front" refers to the edge of the plate facing downstream with respect to a feeding direction of the plate. The pin bar is fed into the treatment station by means of a dragging system which is inside the station itself. More precisely, this system is configured to couple the opposite ends of the pin bar and to move it along said advancement direction. During such an advancement, the pin bar maintains an alignment direction transversal to the advancement direction by dragging the digital plate coupled thereto.

In systems of this type, the connection between plate and pin bar always requires a manual intervention. In particular, an operator firstly proceeds by piercing a plurality of holes through the plate in which the pins of the bar can be inserted. A punching device, in nearly all cases separate from the rest of the system, is used for this purpose. Once the holes are defined through the plate, the operator proceeds by manually connecting the plate to the pin bar (by inserting the pins into corresponding holes) and positioning the pin bar in a predetermined position near the inlet of the treatment station. In such a position, the pin bar can be coupled and dragged, together with the plate, by the dragging system inside the treatment station.

So, as a whole, the feeding of an in-line plant, and more in general of a treatment station, currently requires the manual intervention of an operator to load the plate, to connect the plate to the pin bar and finally to place the latter in the predetermined position for coupling it to the dragging system inside the first treatment station of the system. The need for a manual intervention is also found in systems in which the photo-exposure station is autonomous with respect to the in-line plant, in which the first treatment station is the washing station. In this case, the operator is required to perform a further intervention to physically transport the plate exiting from the exposure station to the punching device.

It is apparent that the manual loading of the plates is a clearly critical aspect in terms of costs. In addition to this, manual operations, despite their apparent simplicity, are intrinsically accompanied by a certain degree of risk. Furthermore, all the steps required by the loading process (piercing holes, connecting the plate to the pin bar and positioning the pin bar) are entrusted solely to the attention and the skill of the operators. This aspect is clearly critical in terms of reliability.

Given considerations above, it is the main task of the present invention to provide a feeding assembly for automatically loading a flexographic plate in a treatment station, which allows to overcome the drawbacks of the prior art. In the scope of this task, it is a first object of the present invention to provide a feeding assembly which allows the automatic connection, i.e. without the manual intervention of an operator, of a flexographic plate to a pin bar which can be dragged by a system inside the treatment station. It is another object of the present invention to provide a feeding assembly which allows a continuous loading, i.e. without interruptions and/or dead times. It is a not last object of the present invention to provide a feeding assembly which is reliable and easy to be manufactured at competitive costs.

SUMMARY

The present invention thus relates to a feeding assembly for automatically loading a flexographic plate in a treatment station. The assembly according to the invention is characterized in that it comprises:
- a loading surface, on which the flexographic plate is arranged, and an advancement surface, adjacent to said loading surface;
- handling means for moving the plate on said advancement surface between the loading surface and an inlet section of said treatment station, wherein the handling means define a longitudinal direction of displacement for the plate, a transversal direction orthogonal to the longitudinal direction and a vertical direction, orthogonal to the transversal direction and to the longitudinal direction;
- housing site in which a pin bar is arranged, wherein said housing site comprises a plurality of mutually aligned pins, such a bar is oriented so that said pins are aligned along the transversal direction;
- a punching unit comprising punching means which, in an activation configuration thereof, pierce a row of connecting holes through the plate.

According to the invention, the handling means of the feeding assembly further comprise:
- a first handling unit of said plate which moves said plate along said longitudinal direction to take a front edge thereof to a first reference position at the reaching of which the punching means are activated to carry out a first row of holes near the front edge itself,
- a second handling unit which, following the carrying out of said holes, moves the plate along said longitudinal direction to a second reference position, at the reaching of which, said holes are aligned with corresponding pins of the pin bar. Furthermore, according to the invention, the feeding assembly comprises a pressing device for connecting the plate to the pin bar such a pressing device applies a pressure on the plate as a result of which at least one pin of the bar is inserted in a corresponding hole of the plate and wherein following the connection between the plate and the bar, the second handling unit lifts the bar and moves it along said longitudinal direction to a third reference position in which said bar can be coupled to a dragging system of said treatment station.

The feeding assembly according to the invention allows to connect automatically a flexographic plate to a pin bar while loading, again automatically, said pin bar into a treatment station of the plate. The feeding assembly according to the invention may be used to load a flexographic plate into the first station of an in-line treatment system but could be used for feeding a totally autonomous treatment station.

LIST OF DRAWINGS

Further features and advantages of the present invention will become more apparent from the following detailed description provided by way of non-limiting example and shown in the accompanying drawings, in which.

The same reference numbers and letters in the figures refer to the same elements or components.

DETAILED DESCRIPTION

With reference to the aforesaid figures, the present invention thus relates to a feeding assembly 1 for automatically inserting/loading a flexographic plate 5 in a treatment station 7 of the plate itself. In particular, the assembly 1 according to the invention is configured to connect, in automatic manner and without intervention by an operator, the plate 5 to a pin bar 14 intended to be dragged through the treatment station 7 by means of a dragging system. For the purposes of the present invention, the expression pin bar 14 (or more simply bar 14) indicates a body, preferably plate-shaped, which identifies a main direction of development 105. The bar 14 comprises a plurality of pins 15 which emerge from a same side of the body and which are aligned along a direction parallel to the main direction 105.

Figure 1:
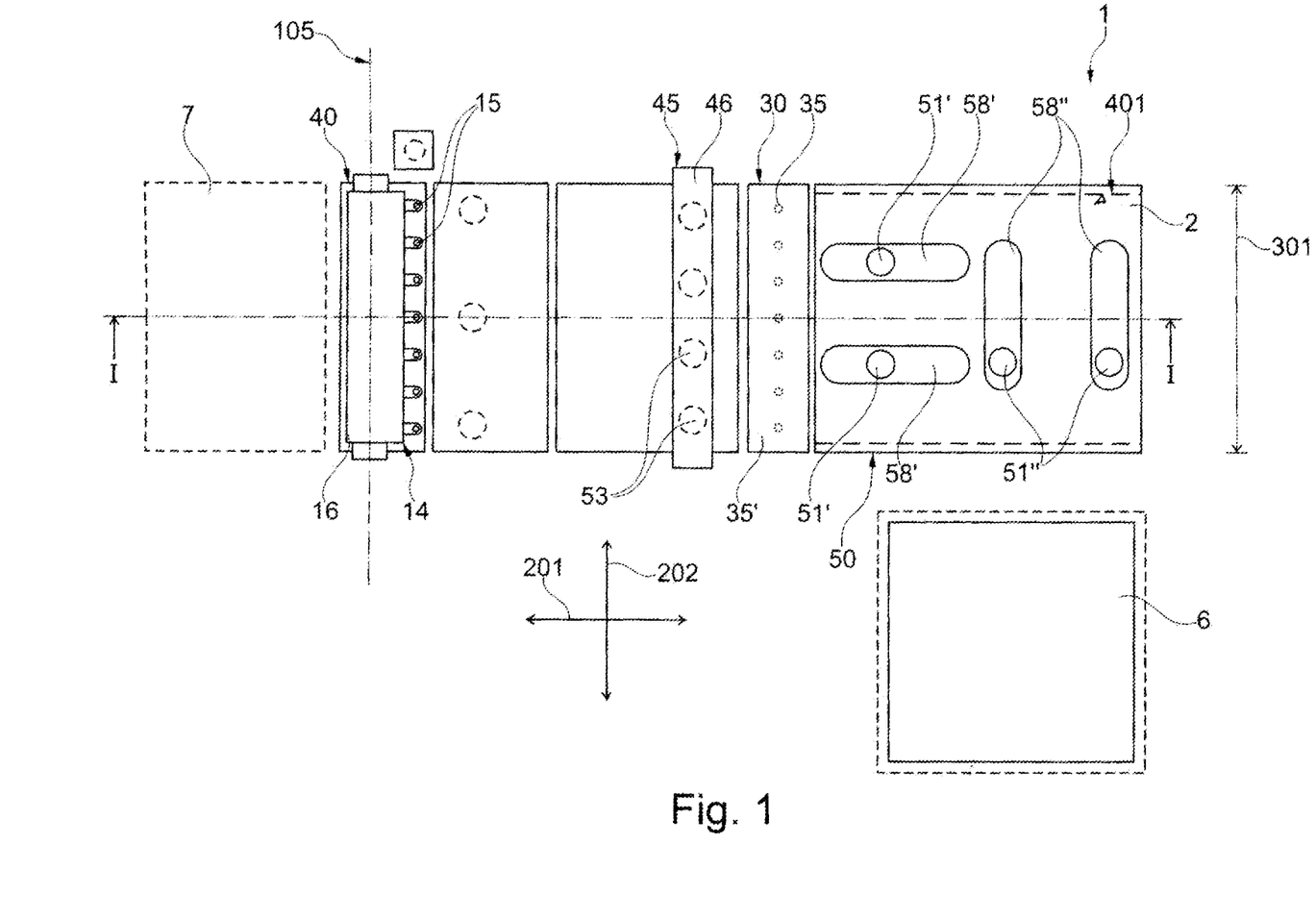
FIG. 1 is a diagrammatic view of a feeding assembly according to the present invention.

FIG. 1 is a diagrammatic plan view of a treatment system of flexographic plates comprising an assembly 1 according to the invention. In particular, in this example, the assembly 1 is operatively interposed between a first exposure station 6 and a washing station 7. The latter could be the first station of a system comprising several stations in line. It is worth noting that the assembly 1 according to the invention can also be used for loading plates in an in-line system in which the first station is an exposure station. Furthermore, in a further possible application, the assembly 1 can also be used to load a flexographic plate in an entirely autonomous treatment station (washing, exposure, drying), i.e. not in line with other stations.

The feeding assembly 1 comprises a loading surface 2 on which the plate 5 is placed designed to be loaded in the treatment station 7. Such a loading surface identifies a substantially horizontal reference plane 101'. Preferably, the plate 5 is automatically placed on the loading surface 2. For example, in the diagram of FIG. 1, the exposure station 6 is arranged in a lateral position, vicinal to the loading surface 2 so that the plate 5, at the exposure station 6 outlet, lands directly onto the loading surface 2. In a possible constructional variant, the system could comprise two exposure stations arranged on opposite sides of the loading surface 2.

The feeding assembly 1 further comprises an advancement surface substantially defined between the loading surface 2 and an inlet section 71 of the treatment station 7 in which the plate 5 must be loaded. The expression "advancement surface" indicates a set of parts which define, as a whole, a substantially horizontal reference plane 101, along which the plate 5 rests, either completely or partially, during its movement toward the treatment station 7. Preferably, but not exclusively, the reference plane 101' defined by the loading surface 2 and the reference plane 101 are coplanar.

The assembly 1 according to the invention comprises handling means 45,50 of the plate 5 configured to move the plate 5 between the loading surface 2 and the inlet section 71 of the treatment station 7. In particular, the handling means 45,50 may intervene either directly or indirectly (through the bar 14 pins) on the plate 5 according to the principles set out below. As a whole, the moving means 45,50 define a longitudinal direction 201 of displacement along which the plate 5 is moved. For the purposes of the present invention, the expression "transversal direction 202", instead, means a direction substantially orthogonal to the longitudinal direction 201. Furthermore, the expression "vertical direction 203" means a direction orthogonal to the surface defined by directions 201 and 202.

Figure 7:
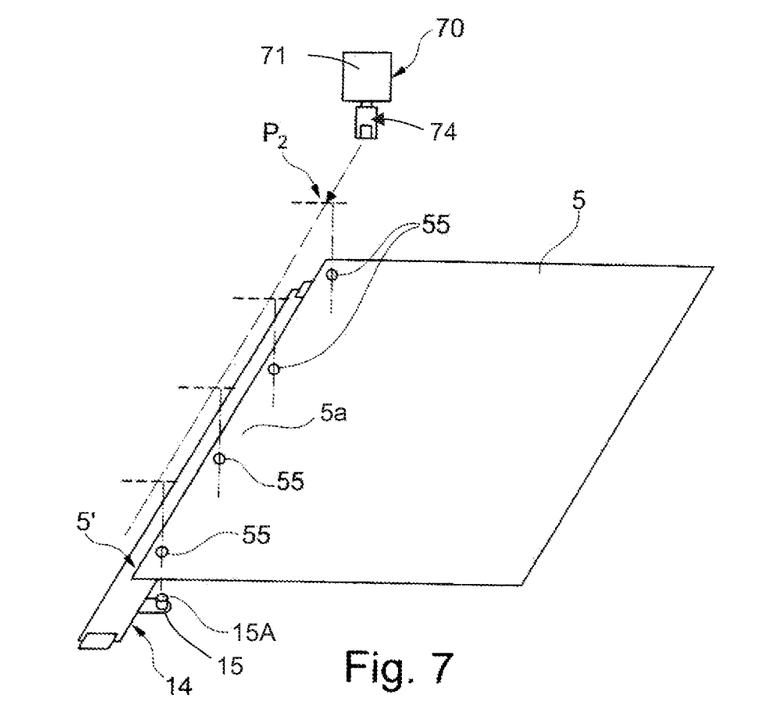
FIGS. 7 and 8 are diagrammatic views related to an operative step of a feeding assembly according to the present invention.

The assembly 1 according to the invention comprises a punching unit 30 comprising punching means 35 which, in an activation configuration thereof, pierce a row of connecting holes 55 through the plate 5 (see FIG. 7). In particular, the punching means 35 are configured to provide holes 55, the shape of which is such as to allow the insertion of a pin 15 of said rod 14 into each of them. The punching unit 30 is located downstream of the loading surface 2, preferably in a position adjacent thereto.

The assembly 1 according to the invention further comprises a housing site 40 in which the bar 14 is accommodated. More precisely, the bar 14 is oriented in a transversal direction, i.e. so that the respective pins 15 are aligned along the transversal direction 202 (orthogonal to the longitudinal direction 201).

According to the present invention, the handling means of the plate 5 comprise a first handling unit 50 which moves the plate 5 along the longitudinal direction 201 to take a front edge 5' thereof to a first longitudinal reference position (indicated by P1) upon the reaching of which the punching means 35 are activated to carry out a row of connection holes 55 through the plate itself near said front edge 5'.

According to the present invention, the handling means of the plate 5 also comprise a second handling unit 45 to move the plate 5 following the formation of the connection holes 55. In particular, in a first operative step, the second handling unit 45 raises and moves the plate 5 along the longitudinal direction 201 to a second reference longitudinal position (indicated by P2). In particular, said second position is such that the connection holes 55 are aligned with the pins 15 of the bar 14. In other words, the second handling unit 45 moves the plate 5 until an alignment position is reached such that the axis of each hole 55 is substantially aligned with the axis of a corresponding pin 15. Upon reaching said second position P2, the second handling unit 45 releases the plate 5 preferably in such a condition that the plate 5 itself, at the connection holes 55, rests against the pins 15 of the pin bar 14 (preferred alignment condition).

The assembly 1 according to the invention comprises a pressing device 70 which acts on the plate 5 to connect it to the bar 14. More precisely, the pressing device 70 presses the plate 5 near the connection holes so that each pin 15 is inserted in a corresponding hole 55. According to a preferred embodiment, the pressing device 70 is configured to apply a thrust/localized pressure around each hole 55, which in said second position P2, is precisely aligned with a corresponding pin 15. This localized pressure is such as to push the plate region about the hole 55 at the base of the corresponding pin 15, thus ensuring its complete insertion in the respective hole and thus allowing the connection of the plate 5 to the hole 55, as a whole. According to a preferred embodiment, shown in the figures, the pressing device 70 is movable in the transversal direction 202, so as to intervene in succession/sequence on each hole-pin pair.

According to an alternative embodiment, not shown in the figures, the pressing device 70 may be shaped so as to act simultaneously on each pin-hole pair, i.e. so that all the pins 15 are inserted simultaneously into the corresponding holes 55.

In all cases, according to the present invention, once the connection of the plate 5 to the bar 14 has been completed, and thus in a second operative step, the second handling unit 45 lifts the bar 14 (with which the plate 5 has become integral) and moves it to a third reference position P3 at which the pin bar 14 can be coupled with the dragging system 77 of the treatment station 7.

According to that shown above, the second handling unit 45 intervenes directly on the plate 5 in the first operative step, while it intervenes directly on the pin bar 14 in the second operative step. So, in this second operative step, the second handling unit 45 handles the plate 5 in an indirect manner precisely through the bar 14.

According to a preferred embodiment, the second handling unit 45 raises a front portion 5a of the plate 5 near said front edge 5' in the first operative step. The second position P2 is such that each of the holes 55 takes a position substantially over a corresponding pin 15 of said pin bar 14 (see FIG. 7). When said second position P2 is reached, the second handling unit 45 translates the front portion 5a of the plate 5 downwards (i.e. lowered towards the advancement surface) so it rests on the pins 15 at the holes 55. In particular, the second handling unit 45 aligns the holes 55 with the pins 15 thus preparing the successive intervention of the pressing device 70.

Figure 9:
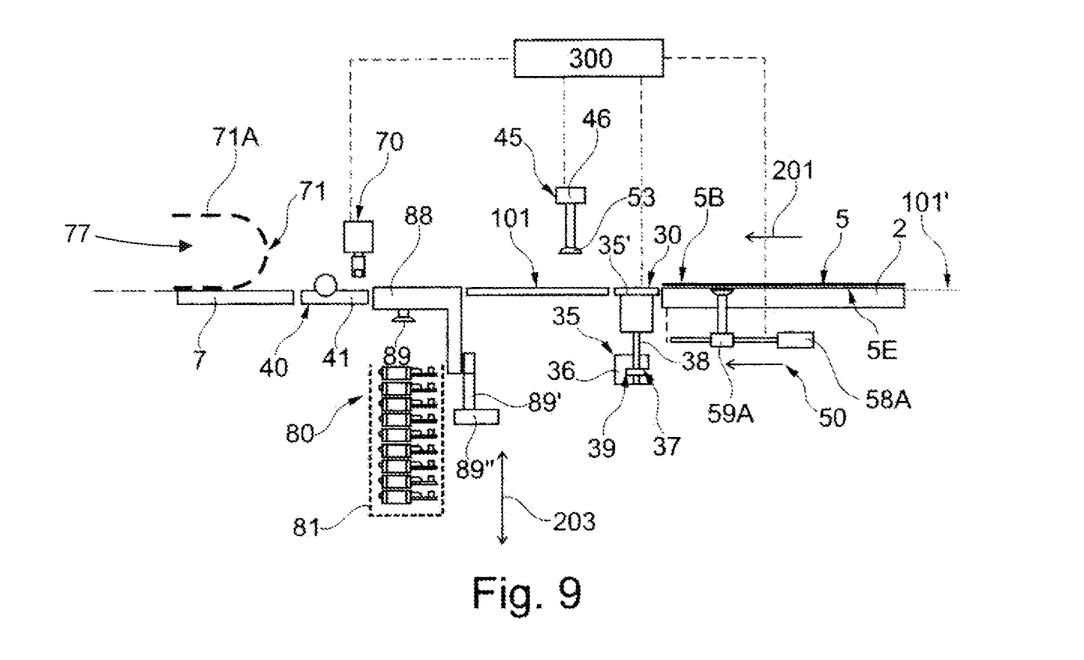
FIGS. 9 to 18 are diagrammatic views taken along the section line I-I in FIG. 1 related to operative steps of the feeding assembly according to the invention.
Figure 10:
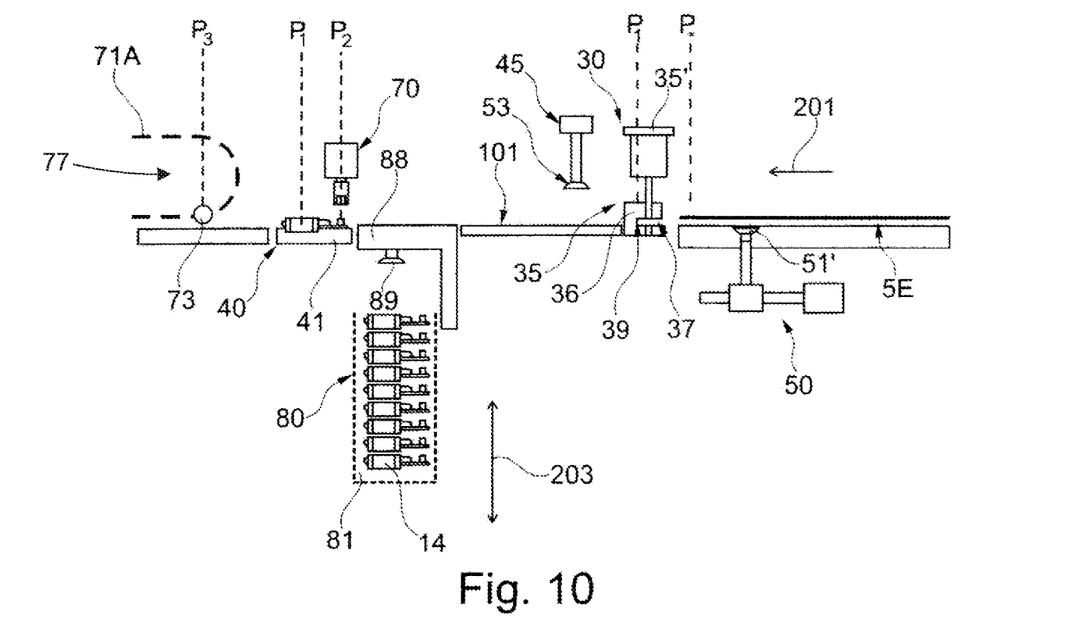
Figure 11:
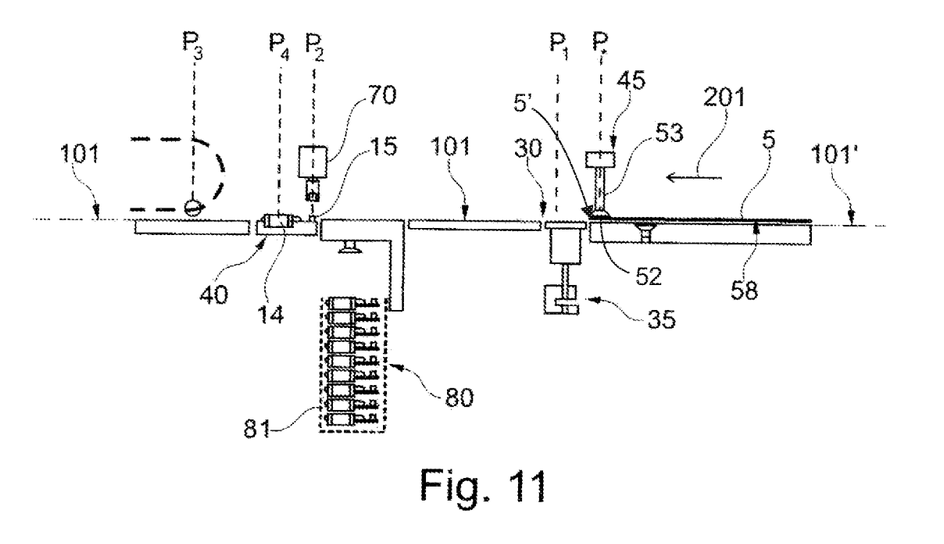
Figure 12:
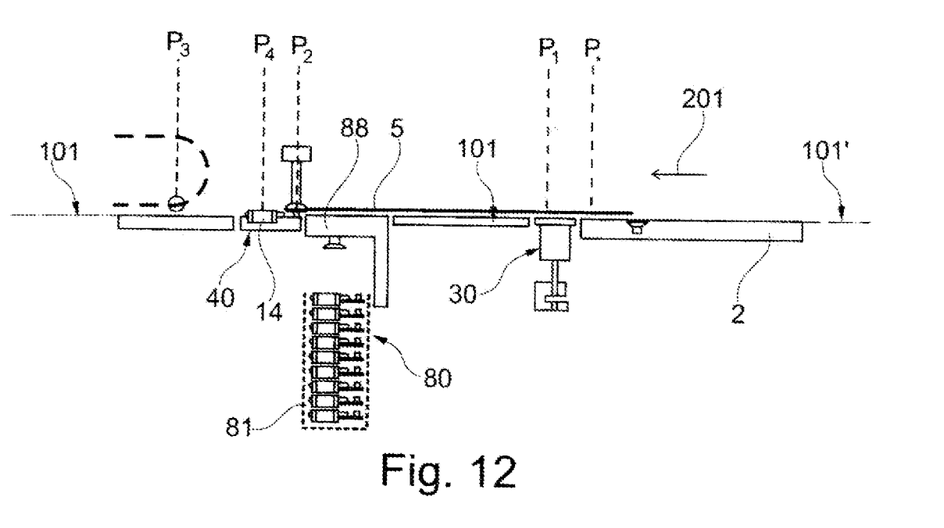

According to a first aspect, the punching units 30 preferably takes a retracted configuration and an emerging configuration with respect to the reference plane 101. In the retracted configuration (diagrammatically shown in FIG. 9), the punching unit 30 is substantially under the reference plane 101 so as not to hinder the movement of the plate 5 along the longitudinal direction 201. In the emerging configuration (diagrammatically shown in FIG. 10), the punching means 35 are located at a predetermined height with respect to the reference plane 101, upon the reaching of which they can carry out holes 55 through the plate 5. According to this preferred embodiment, the punching unit 30 is substantially "retractable", meaning that disappears, when deactivated, below the reference plane 101.

Again according to a preferred embodiment, the punching unit 30 comprises an upper plate 35' to which the punching means 35 are attached. The upper plate 35' defines a portion of the advancement surface when the punching unit 30 takes the retracted configuration. For this purpose, the punching means 35 are fastened to the lower side of the upper plate 35'. As can be seen in the plan view in FIG. 1, the upper plate 35' extends mainly along the transversal direction 202 for a width (indicated by 301) preferably close to that of the loading surface 2. The upper plate 35' has a substantially rectangular shape, seen from the top.

In a preferred embodiment, the punching means 35 comprise a body 36 which extends prevalently in the transversal direction 202 for a length substantially close to the width 301 of the upper plate 35'. Such a body 36 defines a cavity 37 facing the loading surface 2 into which a front portion 5A of said plate 5 can be inserted, and preferably supported. More precisely, the body 36 and the cavity 37 have a transversal extension such as to allow the front portion 5A to be inserted for the whole length thereof.

The punching means 35 comprise a plurality of punching elements 38, each of which serves to carry out one of the connection holes 55. The punching elements 38 are aligned along a direction parallel to the transversal direction 202 and, in an activation configuration, move vertically with respect to the body 36 so that their ends penetrate through the plate 5, whereby configuring the coupling holes 55 according to a principle can be easily inferred.

According to another aspect, the cavity 37 of the body 36 defines an abutment surface 39 for a front edge 5' of the plate 5. Such a abutment surface 39 extends parallel to the transversal direction 202. Preferably, the abutment surface 39 establishes the first reference position P1 indicated above. Substantially, the first handling unit 50 moves the plate 5 until its front edge 5' comes into contact with the abutment surface 39. When such a condition is reached, the punching means 35 are activated so that the punching elements 38 pierce the connection holes 55 through the plate 5. These will therefore be defined near the front edge 5' and aligned along the transversal direction 202, parallel to the edge itself.

Figure 2:
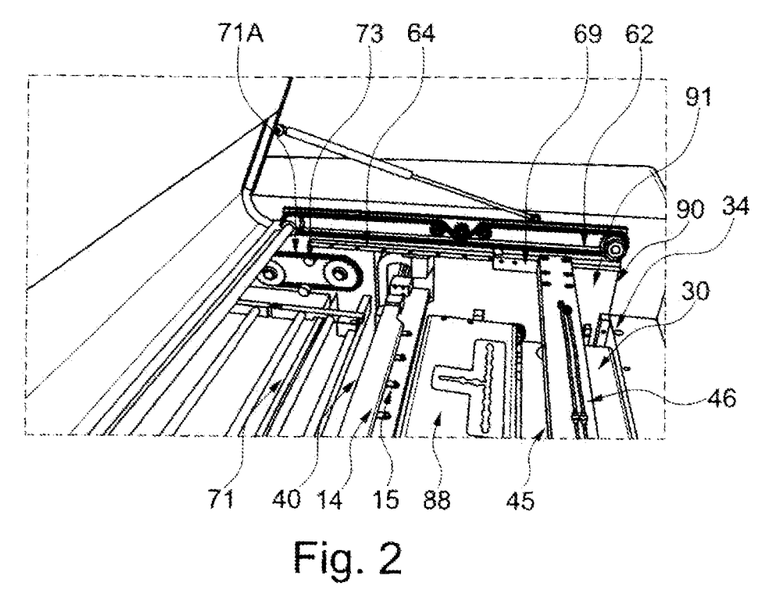
FIG. 2 is a perspective view of a group of components of the feeding assembly according to the present invention.

The punching unit 30 comprises lifting means 34 (indicated in FIG. 2) which raise and lower the upper plate 35', and more in general the punching means 35, with respect to the reference plane 101. In a possible embodiment, such lifting means may comprise electric actuators which act on the opposite ends of the upper plate 35' and/or on the opposite ends of the body 36 of the punching means 35. Such lifting means 34 may be installed on the supporting frame 90 which supports the parts defining the advancement surface.

With reference again to FIG. 1, the housing site 40 is operatively positioned downstream of the punching unit 30 and preferably in a position substantially adjacent to the inlet section 71 of the treatment station 7. In a preferred embodiment, the housing site 40 is defined by a supporting plate 41 supported by the sides 91 of the frame 90. As a whole, the frame 90 supports the advancement surface. The pin bar 14 rests on the plate 41 with a side opposite to the one from which the pins 15 emerge.

The housing site 40 comprises removable locking means which lock the bar 14 in a predetermined longitudinal position. In a possible embodiment shown in FIG. 4, the locking means comprise a pair of locking modules 49, each of which is installed on a side 8 of the supporting frame 90 to intervene on a corresponding end 14A,14B of the bar 14. Such modules 49 comprise an actuator 42 which moves a locking pin 43 between a retracted position in which it does not interact with the bar 14, and an extended position. In the latter position, the locking pin 43 is inserted in a cavity 16 defined at an end 14A, 14B of bar 14 so as to lock the translation of the bar itself on the moving surface. In particular, the locking condition is maintained until the connection between plate 5 and bar 14 has been finally completed. Having reached this condition, the locking means are deactivated so as to allow the second handling unit 45 to move the pin bar 14 from the housing site 40 up to the third reference position P3 in which it will be coupled by the dragging system 77 of the treatment station 7.

Figure 8:
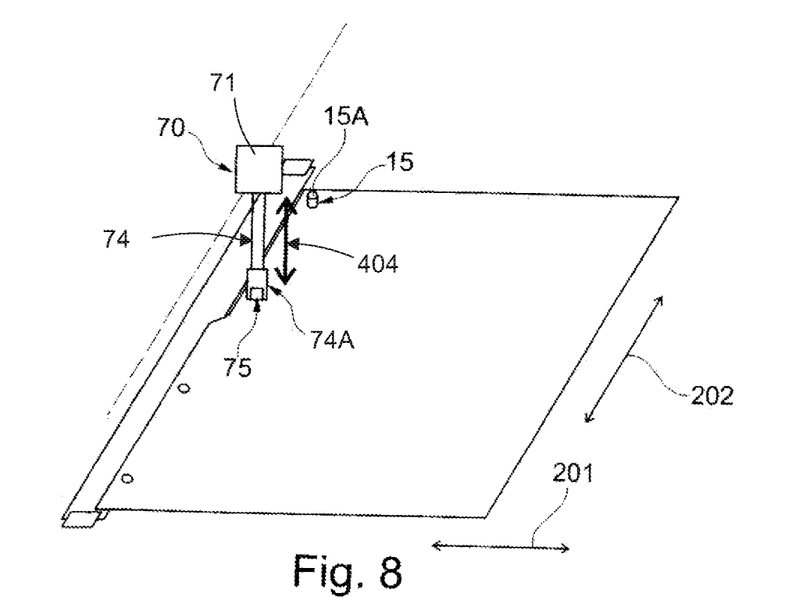

FIGS. 7 and 8 diagrammatically show in detail the step of connecting the plate 5 to the pin bar 14; according to that indicated above, such a connection is made at the housing site 40 and following the displacement of the plate 5, made by the second handling unit 45, up to the second position P2. At the second position P2, each hole 55 of the plate 5 takes a position substantially over a corresponding pin 15 of the bar 14, i.e. the axis of each hole 55 is substantially aligned with the axis of the corresponding pin 15. The connection between plate 5 and pins 15 is obtained by activating the pressing device 70.

As indicated above, the pressing device 70 is preferably configured to apply a localized pressure on the plate 5 about the edge of a hole 55 aligned with a corresponding pin 15. In particular, the pressing device 70 is configured to apply a pressure which is such as to locally push the plate 5 at the base of said corresponding pin 15, whereby guaranteeing full insertion in the corresponding hole 55. Preferably, the pressing device 70 is structurally independent from the second handling unit 45 and is movable in the transversal direction 202 to intervene at each pair hole-pin, the word "pair" indicating a hole 55 and the corresponding pin 15.

Figure 5:
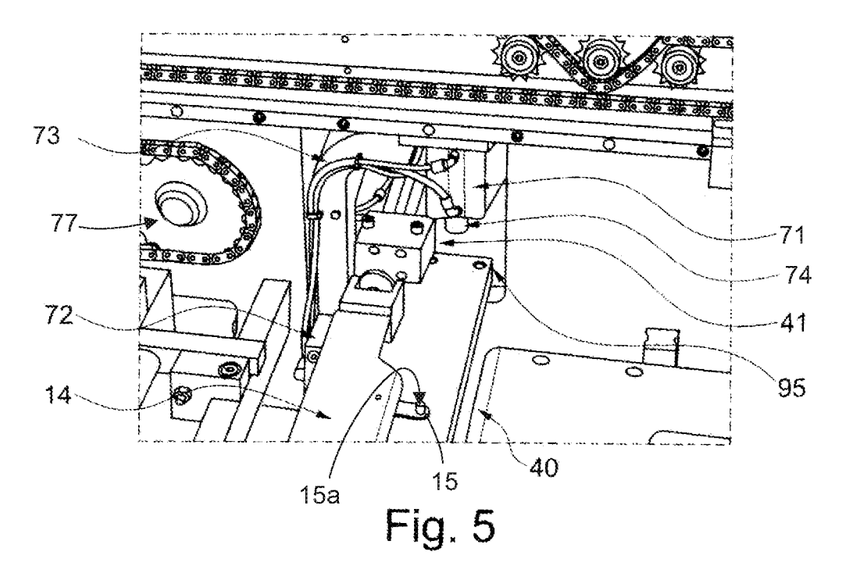
Figure 6:
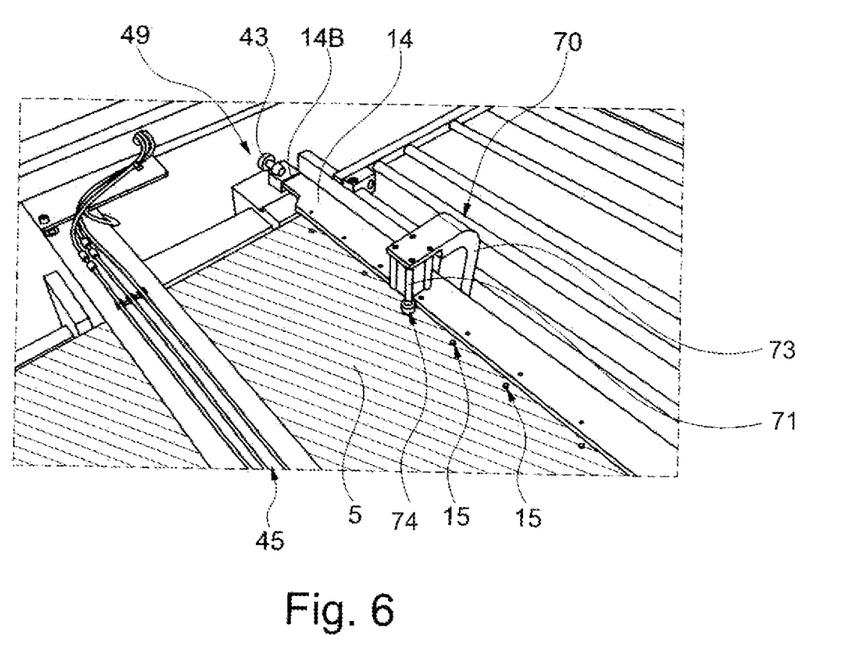
FIG. 6 is a perspective view of a pressing unit of the feeding assembly according to the present invention.

In the embodiment shown in FIGS. 5, 6 and 8, the pressing unit 70 preferably comprises an actuator 71 (either electric or pneumatic) mounted by means of a supporting arm 73 on a slide 72 movable along the transversal direction 202. Such an actuator 71 vertically moves a presser 74 comprising a cylindrical end 74A which defines a cavity 75 in which the head 15A of a pin 15 of the bar 14 can be inserted. In particular, the actuator 71 moves the presser 74 vertically (arrow 404) between a raised non-intervention position and a lowered intervention position. Considering a hole-pin pair, in reaching the lowered position, the head 15A of the pin 15 is inserted into the cavity of the presser 74, while the edge of the cylindrical end 74A locally pushes the portion of plate 5 about the hole 55 to the base of the pin 15. Once the presser device 70 has treated all the hole-pin pairs in sequence, the plate 5 is constrained in a stable manner to the pin bar 14.

Preferably, one of the sides 91 of the supporting frame 90 defines a receiving housing 95 in which the pressing device 70 remains housed during the longitudinal movement of the plate 5 and/or of the bar 14 (see FIG. 5). In particular, the pressing device 70 is preferably actuated when the second handling unit 45 has released the plate 5. In this condition, the pressing device 70 moves transversely to a first transversal position corresponding to the first hole-pin pair. Having reached such a first position, the pressing element 74 is lowered by the actuator 71 to complete the connection. As can be inferred from the diagram in FIG. 8, the pressing device 70 is displaced in transversal direction 202 whereby processing each hole-pin pair. Once the operation has been completed, the pressing device 70 returns into the receiving housing 95 so as not to hinder the subsequent translation of the bar 14 and of the plate 5 towards the treatment station 7.

Preferably, before the activation of the pressing device 70, the first handling unit 50 is activated again to temporarily lock the plate 5 in the second position P2. The activation of the first handling unit 50 has the purpose of preventing any movement of the plate 5 on the movement surface during the subsequent intervention of the pressing device 70. As soon as the latter has completed the connection of the plate 5 to the bar 14, the first handling unit 50 is deactivated to allow the successive movement, achieved by the second handling unit 45, of the plate 5 in the third reference position P3 indicated above.

Preferably, the first handling unit 50 comprises first handling elements 51' configured to intervene on the plate 5 and to adjust its position along the longitudinal direction 201. In a preferred but not exclusive embodiment, such first elements 51' are operatively placed in a position below the reference plane 101' defined by the loading surface 2 in order to act on the lower surface 5E of the plate 5. More precisely, the first elements 51' are vertically movable between a non-intervention position, in which they are below the reference plane 101', and an intervention position, in which they act on said lower surface 5E. Further, the first elements 51' are movable also in parallel to the longitudinal direction 201 so as to adjust the position of the plate 5 along the same direction.

Preferably, said first elements 51' are of the suction cup type, i.e. comprise a body provided with a suction cup end susceptible of attaching itself to said lower surface 5E, following the application of vacuum between the suction cup body and the surface, according to a principle known per se.

The first handling unit 50 further comprises first adjusting means 58A in the longitudinal direction 201 and second adjustment means 59A in a vertical direction 201 to achieve the movements of the first elements 51' in the corresponding direction. The adjustment means 58A may consist of electric actuators, mounted on slides. The second adjustment means 59A may, in turn, be constituted by additional electric actuators operatively connected to said slides.

In a possible embodiment shown in FIG. 1, the loading surface 2 defines first grooves 58' through which the first suction cup elements 51' emerge to adhere against the lower surface 5E of the plate 5. Such first grooves 58 extend in the longitudinal direction 201

In a first possible embodiment, the first longitudinal actuating means 58A move the first handling elements 51' so that they take the same position along the longitudinal direction 201. Therefore, as a whole, the first elements means 51' form only a longitudinal translation of the plate 5.

In an alternative embodiment, the first adjustment means 58A may move the first handling elements 51' independently, i.e. allowing them to take different longitudinal positions. This translates into the possibility of imposing a translational motion to the plate 5 in the longitudinal direction, but also a roto-translational movement designed to correct the orientation of the plate 5 itself. In particular, the purpose of such a correction would be to orient the front edge 5' parallel to the transversal direction 202.

According to the above, when the second position P2 is reached and before actuating the pressing device 70, the first handling elements 51' are preferably activated to lock the plate 5, whereby avoiding any translation thereof in longitudinal direction 201. Once the pressing device 70 has completed the connection between the plate 5 and the bar 14, the first elements 51' are deactivated to allow the subsequent longitudinal displacement of the plate 5.

With reference again to FIG. 1, the first handling unit 50 preferably also comprises second handling elements 51" configured to act on the plate 5 and to adjust its position along the transversal direction 202. Preferably, the second elements 51" have a configuration similar to that of the first elements 51'. So, also the second elements 51" are preferably of the suction cup type. The second elements 51" are movable in a vertical direction 203 and in transversal direction 202. Therefore, the handling unit will comprise further adjustment means in vertical direction (not shown) and adjusting means in transversal direction (not shown). The configuration of the adjustment means of the second handling elements 51" may substantially correspond to that described for the first elements 51'.

As shown with respect to the first elements 51', also the second elements 51" are preferably located in a position below the reference plane 101' defined by the loading surface 2. Preferably, the latter defines second grooves 58" which extend in transversal direction to allow the second suction cup elements 51" to stick to the bottom surface 5E of the plate 5 and to move along the transversal direction 202. Said adjustment means in transversal direction 202 may be configured to move the second elements 51" so that they take the same transversal position. Alternatively, said adjustment means in transversal direction can provide an independent adjustment of the second elements 51", so as to introduce a roto-translation movement adapted to facilitate the orientation of the plate 5.

According to another aspect of the present invention, the second handling unit 45 preferably comprises a transversal bar 46, the position of which can be adjusted along the vertical direction 203 and along the longitudinal direction 201. Therefore, the transversal bar 46 has two degrees of freedom and supports a plurality of handling elements 53, preferably of the suction cup type, aligned along a direction parallel to the transversal direction 202. According to the objects of the present invention, the handling elements 53 are configured to raise and support the plate 5 during the movement up to the second reference position P2 and to raise and support the bar 14, and thus the plate 5, until they reach a third reference position P3 in which the bar 14 is released.

Figure 3:
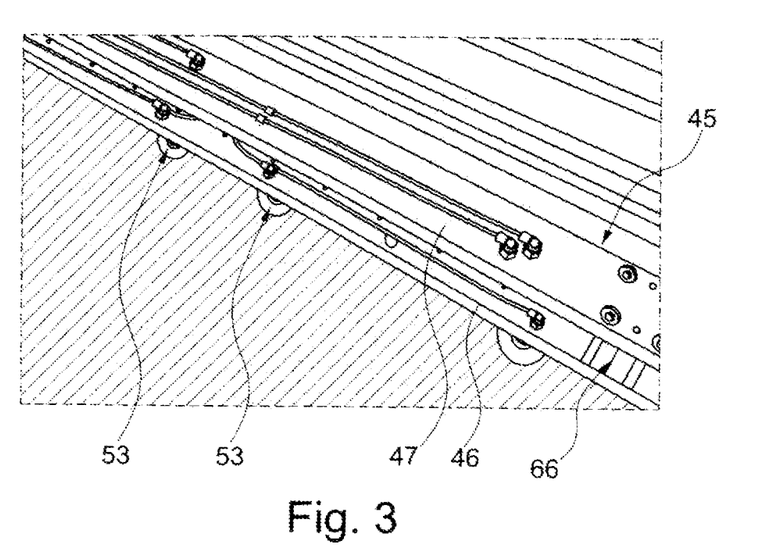
FIG. 3 is a perspective view of a handling unit of the feeding assembly according to the present invention.

FIG. 3 shows a possible embodiment of the second handling unit 45 and in particular of the bar 46 which emerges with respect to the reference plane 101. In order to allow the movement of the transversal bar 46 along the two directions (longitudinal 201, vertical 203) indicated above, the second handling unit 45 comprises first actuation means and second actuation means for respectively moving the transversal bar along the vertical direction 203 and along the longitudinal direction 201. In an embodiment shown in FIGS. 2 and 3, the first actuation means comprise a pair of actuators 66, each of which is connected to one end of the transversal bar 46. The two actuators 66 are fixed to a supporting bar 47 over the transversal bar 60. The supporting bar 61 maintains the same height relative to the advancement surface 3, while the two actuators 66 lift and lower the transversal bar 46. For this purpose, each of the ends of the supporting bar 61 is mounted on a corresponding slide 69 which can slide along a guide 64 connected to a side 91 of the supporting frame 90. The second actuating means comprise a drive chain 62 for each slide 69, preferably actuated by an electric motor, which is connected to a corresponding slide 69 to drag it in longitudinal direction 201. It is within the scope of the present invention the possibility of providing the second handling unit in a constructionally different but functionally equivalent manner with respect to that described above.

According to a further aspect, the feeding assembly 1 according to the invention preferably also comprises a recharging device 80 to automatically position a pin bar 14 in the housing site 40 defined above. With reference to the diagrammatic views from 9 to 18, the recharging device 80 comprises a storage box 81 in which a plurality of pin bars 14 are housed. Such a box 81 is preferably located in a position below the reference plane 101. The recharging device 80 comprises gripping and moving means 88, 89 which, when activated, pick a bar 14 accommodated in the box 81 and release it at the housing site 40 defined above.

In a preferred embodiment, the gripping and moving means comprise a lift bar 88 which, in a non-activation condition of the recharging device 80, defines a portion of the reference plane 101 (see FIG. 1), preferably between the housing site 40 and the punching unit 30. The gripping and handling means comprise gripping elements 89, preferably of suction cup type, which emerge from the lower side of the lifting bar 88, whereby being aligned in the transversal direction 202. In this preferred embodiment, the box 81 configures a volume in which a plurality of superimposed and oriented pin bars 14 are housed in the transversal direction 202. Preferably, the box 81 is extracted and inserted below the reference plane 101 through a movement in transversal direction 202. This translation allows to reload the box 81 with a series of pin bars 14.

The lifting bar 88 is movable in the vertical direction and in the longitudinal direction so as to form a sequence of movements (vertical and longitudinal) such as to allow the picking of a bar 14 from the box 81 and the successive release thereof at the housing site 40. In the embodiment shown in the figures, the longitudinal position in which the bar 14 is picked from the box 81 is different (and more retracted than the advancement direction 201) from the longitudinal position in which the pin bar 14 itself is released (at the housing site 40). However, the two longitudinal positions indicated above may also coincide; for example, the box 81 may be located under the housing site 40.

In order to allow the movement of the bar 14 to the housing site 40, the recharging device 80 further comprises further first displacement means 89' and second displacement means 89" to achieve the vertical movements (direction 203) and longitudinal movements (direction 201) of the bar 14, respectively. Such displacement means 89',89" may consist of actuators and longitudinal handling slides, similarly to the technical solutions described above for the handling units 45,50 of the plate 5.

With reference to the aforesaid figures and particularly to FIGS. 9 to 18, the operating principle of the feeding assembly 1 according to the present invention schematically shown in FIG. 1, which is a preferred but not exclusive embodiment, is illustrated below. In this regard, the feeding assembly 1 comprises a control unit 300 (shown in FIG. 9) for controlling the handling means of the punching units, and in general of all the aforementioned of the assembly 1 according to the invention.

The plate 5 exits from the exposure station 6 in transversal direction 202. When a portion of the plate 5 rests on the loading surface 2, the second handling elements 51" intervene on such a portion, whereby guiding the plate 5 in transversal direction 202 until it rests completely on the loading surface 2 and a longitudinal edge thereof aligns with a transversal reference (indicated by line 401 in FIG. 1). When this condition is achieved, detected by a position sensor, the control unit 300 commands the activation of the punching unit 30, which takes the emerging configuration (see FIG. 10) with respect to the reference plane 101 so that the punching means 35 take a position adapted to provide the holes 55 cross the plate 5. Subsequently, the control unit 300 sends a first control signal to the first handling elements 51', then they intervene on the plate 5 moving it in longitudinal direction 201 until its front edge 5' comes into contact with the abutment surface 39 of the body 36 of the punching means 35 (first reference position P1). Having reached this condition, the control unit 300 activates the punching means 35 so that they pierce the row of holes 55 through the plate 5 near said front edge 5'. The first elements 51' of the first handling unit 50 then retract the plate 5 longitudinally towards the loading surface 2 to a predetermined position (indicated by P* in FIGS. 10 to 18) so as to allow the punching unit 30 to take the retracted configuration in a position below the reference plane 101 (see FIGS. 11 and 12). Having reached this position, the first elements 51' release the plate 5.

Figure 4:
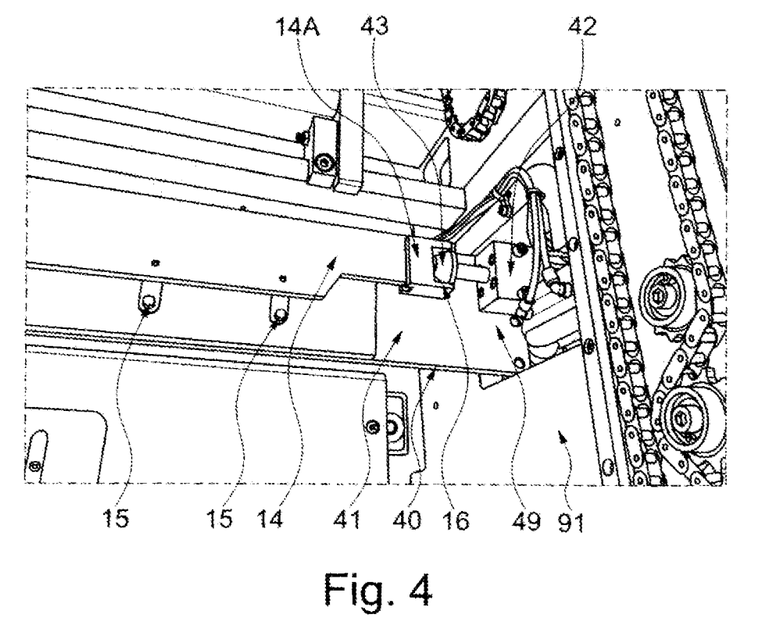
FIGS. 4 and 5 are perspective views from different points of view of a group of components of a feeding assembly according to the present invention.

At this point, the control unit 300 sends a control signal to the second handling unit 45, then the handling elements 53 pick the plate 5 from the predetermined position P*, raising at least one front part 5B of the plate itself near the front edge 5' (condition in FIG. 4). The control unit 300 then commands to the second handling unit 45 a longitudinal displacement (advancing toward the treatment station 7) of the transverse bar 46 until the holes 55 of the plate 5 reach the second longitudinal reference position P2 so that their axis is substantially aligned with the axis of the corresponding pin 15 of the bar 14 located in the housing station 40 (see diagram in FIG. 7). In the advancement between the retracted position P* and the second position P2, the rear part of the plate 5 rests slipping on the reference plane 101.

The control unit 300 then activates the pressing device 70 in order to provide the connection between the plate 5 and the bar 14 according to the principles and procedures set forth above. Before the intervention of the pressing device 70, the control unit 300 commands to the second handling unit 45 a displacement to a neutral position, i.e. such as not to impede the movement in transversal direction 202 and the intervention of the pressing device 70. At the same time, the control unit 300 also command the activation of the first handling elements 51' which intervene on the plate 5 temporarily blocking the movement in the longitudinal direction 201.

Figure 13:
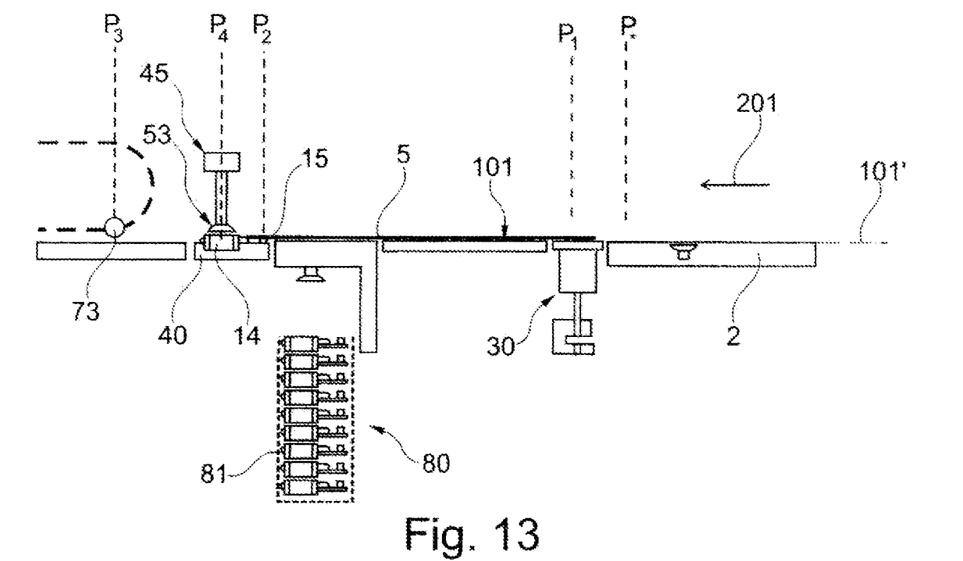
Figure 14:
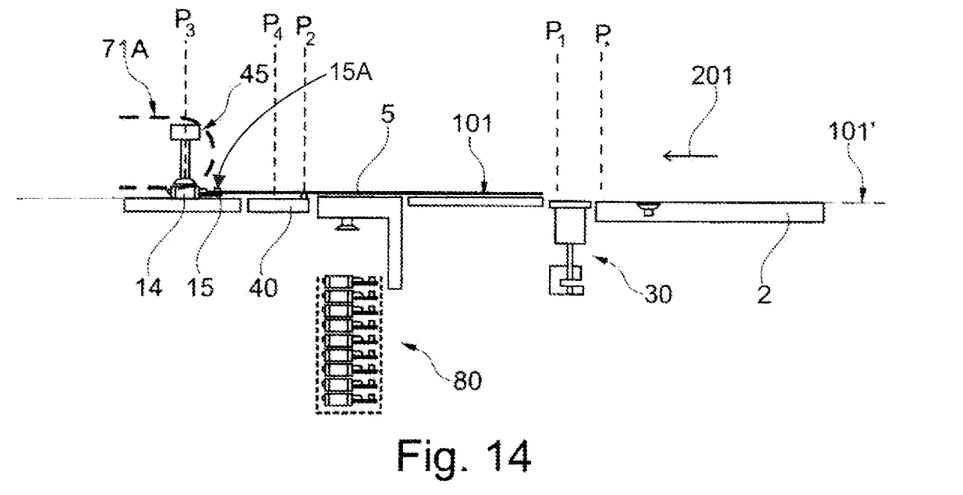

With reference to FIGS. 13 and 14, at the end of the intervention of the pressing device 70, the control unit 300 disables the first handling elements 51' and simultaneously sends a further control signal to the second handling unit 45, then the bar 46 and the handling elements 53 are moved so as to pick the bar 14, displacing longitudinally towards the treatment station 7 and finally releasing it at the defined third reference position P3 in the inlet section 71 of the treatment station 7. The elements 53 of the second handling unit 45 pick the pin bar 14 from a longitudinal housing position P4 which is more advanced than the second reference position P2. Following the release of the bar 14, the bar 45 of the second handling unit 45 is placed in a resting position, relatively remote from the treatment station 7.

Figure 15:
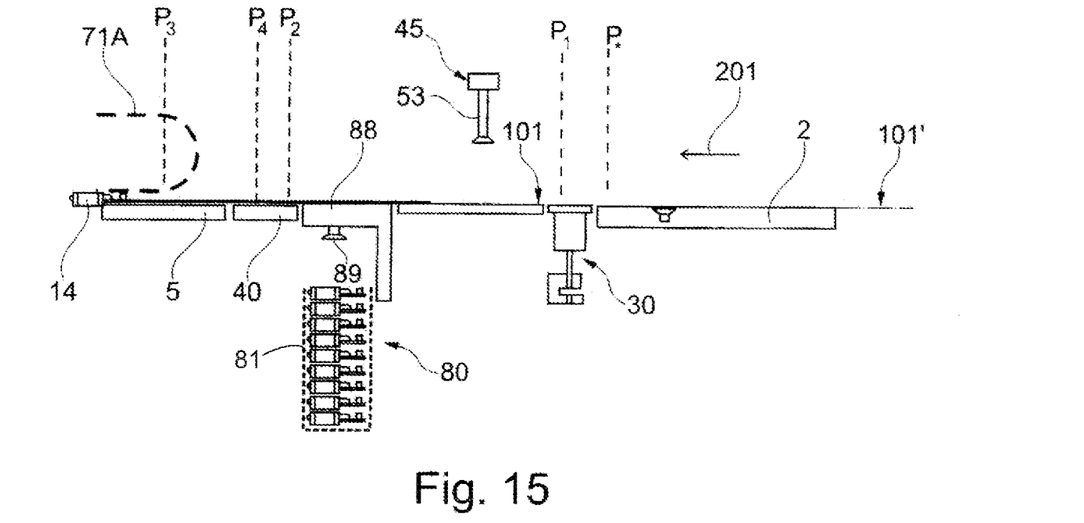

With reference to FIG. 15, once released in the third reference position P3, the pin bar 14 is coupled by the dragging system 71 of the treatment station 7 and dragged inside the station itself. In this regard, such a dragging system 71 preferably comprises two electrically driven dragging chains 71A, each of which is installed on one side of the treatment station 7 (see FIG. 2). Each chain 71A is integral in pin 73 which can be inserted, when said bar 14 is in said third reference position P3 in the cavity 16 defined by a corresponding end 14,14B of the pin bar 14. So, by means of such pins 73, the two chains 71A drag the bar 14 and the plate 5 connected thereto along the treatment station 7.

Figure 16:
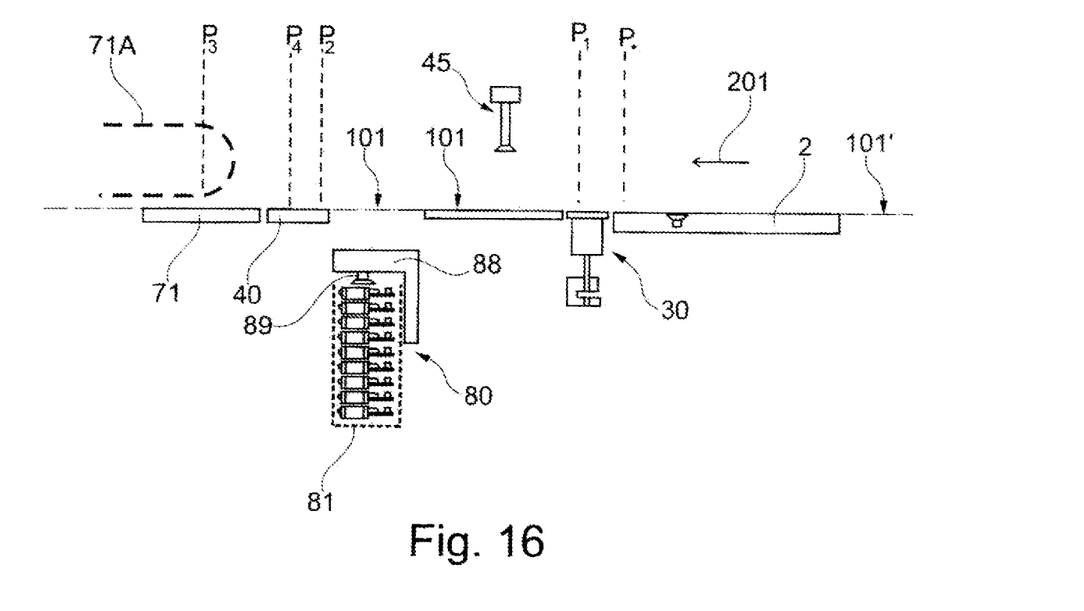
Figure 17:
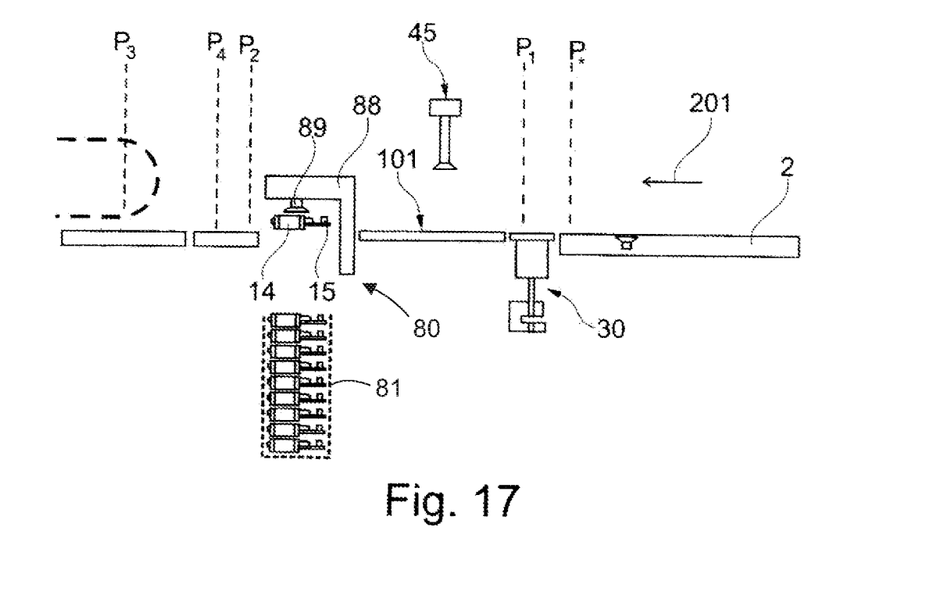
Figure 18:
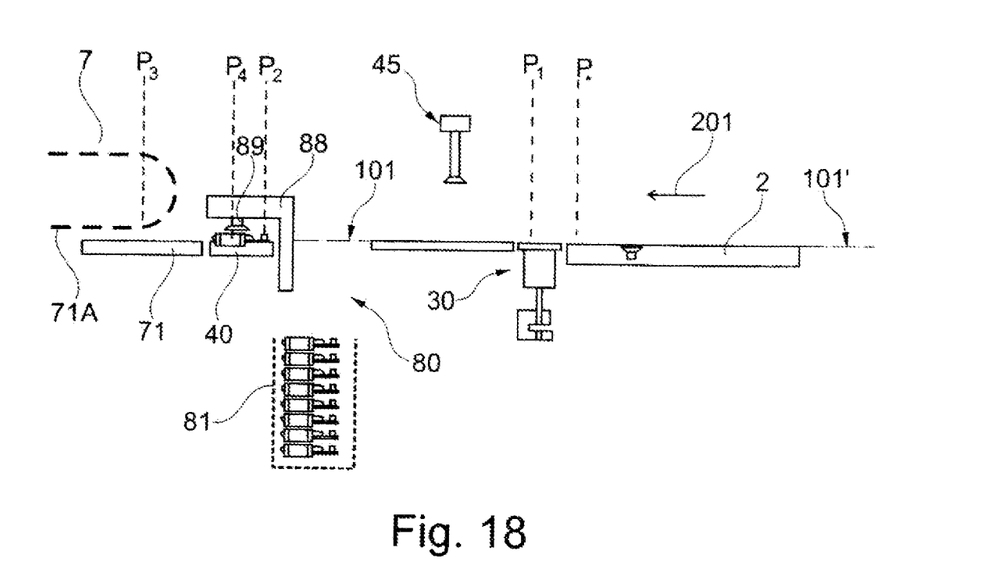

The advancement of the plate 5 in the treatment station 7 is monitored by a position sensor. When the plate 5 is completely inside the treatment station 7, the control unit 300 commands the activation of the recharging device 80 in order to automatically load a pin bar 14 in the housing site 40. The diagrams in FIGS. 16 to 18 show the sequence of movements implemented by the first displacement means 89' and by the second displacement means 89" defined above, which allow the lifting bar 88 and the gripping elements 89 to pick a pin bar 14 from the box 81 (see FIG. 16) and release it into the housing site P4. As apparent, this movement sequence requires a lowering of the lift bar 88 below the reference plane 101, a subsequent lifting above the plane 101 itself (see FIG. 17), a forward movement to the housing position P4 and a successive release in this position (see FIG. 18). Such a sequence is naturally determined by the position of the storage box 81 with respect to the housing site 40. A different relative position could lead to a different sequence of movements.

The described technical solutions allow to fully achieve the predetermined tasks and objects. In particular, the feeding assembly according to the invention allows to connect automatically a flexographic plate to a pin bar while loading, again automatically, said pin bar into a processing station of the plate. The feeding assembly according to the invention may be used to load a flexographic plate into the first station of an in-line treatment system but could also be used for feeding a totally autonomous treatment station.

The invention claimed is:

1. A feeding assembly for loading a flexographic plate in a treatment station, the feeding assembly comprising:
a loading surface configured for placement of a flexographic plate;
an advancement surface adjacent to said loading surface;
a handling assembly for moving the flexographic plate on the advancement surface between the loading surface and an inlet section of the treatment station, the handling assembly defining a longitudinal direction of movement of the flexographic plate, a transversal direction orthogonal to said longitudinal direction, and a vertical direction;
a housing site in which a pin bar is arranged, the pin bar comprising a plurality of mutually aligned pins and being oriented so that the plurality of mutually aligned pins are aligned along a direction parallel to the transversal direction; and
a punching unit operative to pierce a row of connecting holes through the flexographic plate;
wherein the handling assembly comprises:
a first handling unit operative to move the flexographic plate along the longitudinal direction and to position a front edge thereof at a first reference position, the first reference position being located such that when the first front edge of the flexographic plate is positioned at the first reference position, the punching unit is in position to pierce a row of connecting holes through the front edge of the flexographic plate;
a second handling unit operative to move the flexographic plate along said longitudinal direction from the first reference position to a second reference position following the piercing of a row of connecting holes through the flexographic plate, wherein at the second reference position, the row of connecting holes are aligned with the plurality of mutually aligned pins of the pin bar, and
wherein the feeding assembly further comprises a pressing device for connecting the flexographic plate to the pin bar, the pressing device being configured to apply pressure to the flexographic plate in order to cause at least one pin of the pin bar to be inserted in a corresponding connecting hole of the flexographic plate; and wherein, following the insertion of at least one pin of the pin bar in a corresponding connecting hole of the flexographic plate, the second handling unit is further operative to lift the pin bar and move it along the longitudinal direction to a third reference position in which the pin bar is couplable to a dragging system of the treatment station.

2. The feeding assembly according to claim 1, wherein the punching unit is configured to transition between a retracted configuration and an emerging configuration with respect to the advancement surface, wherein in the retracted configuration the punching unit is substantially underneath the advancement surface.

3. The feeding assembly according to claim 2, wherein the punching unit comprises a plurality of punching elements and an upper plate, wherein when the punching unit is transitioned to the retracted configuration, the upper plate defines a portion of the advancement surface and the plurality of punching elements are constrained to a lower side of the upper plate.

4. The feeding assembly according to claim 2, wherein the punching unit comprises a body which extends along the transversal direction and defines a cavity facing towards the loading surface and in which a front portion of the flexographic plate can be inserted, the cavity defining an abutment surface for the front edge of the flexographic plate.

5. The feeding assembly according to claim 1, wherein the housing site comprises a locking assembly for locking the pin bar in a predetermined longitudinal position.

6. The feeding assembly according to claim 5, wherein the locking assembly comprises a pair of locking modules, each of which is installed near a side of a supporting frame, each of said locking modules comprising an actuator configured to transition a locking pin between a retracted position, in which the locking pin does not interact with the pin bar, and an extended position, in which the locking pin is inserted in a cavity defined in a corresponding end of the bar.

7. The feeding assembly according to claim 1, wherein the pressing device comprises an actuator mounted on a slide movable along the transversal direction, the actuator being configured to vertically move a presser, the presser comprising a cylindrical end defining a cavity in which the head of a pin of the pin bar is insertable, wherein the actuator is configured to transition the presser between a lifted non-engagement position and a lowered engagement position, and wherein upon being transitioned to to the lowered engagement position, the cylindrical end of the presser is configured to apply pressure to a local region of the flexographic plate around at least one connecting hole with the cavity being configured to receive insertion of a pin of the pin bar.

8. The feeding assembly according to claim 1, wherein the feeding assembly further comprises a recharging device for positioning the pin bar in the housing site, the recharging device comprising at least one storage box and at least one gripping and moving assembly, the gripping and moving assembly being operative to pick a pin bar from the storage box and release it in the housing site.

9. The feeding assembly according to claim 8, wherein the gripping and moving assembly comprise a lifting bar which supports gripping elements aligned along the transversal direction, the lifting bar being movable along the longitudinal direction and along the vertical direction.

10. A system for treating flexographic plates comprising at least one treatment station for a flexographic plate and at least one feeding assembly according to claim 1 for automatically loading a flexographic plate in said at least one treatment station.

* * * * *